United States Patent
Cayron et al.

(10) Patent No.: US 8,367,547 B2
(45) Date of Patent: Feb. 5, 2013

(54) METHOD FOR CREATING A METAL CRYSTALLINE REGION, IN PARTICULAR IN AN INTEGRATED CIRCUIT

(75) Inventors: Cyril Cayron, Grenoble (FR); Sylvain Maitrejean, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/380,314

(22) PCT Filed: Jul. 1, 2010

(86) PCT No.: PCT/EP2010/059388
§ 371 (c)(1),
(2), (4) Date: Dec. 29, 2011

(87) PCT Pub. No.: WO2011/000923
PCT Pub. Date: Jan. 6, 2011

(65) Prior Publication Data
US 2012/0094486 A1     Apr. 19, 2012

(30) Foreign Application Priority Data

Jul. 3, 2009 (FR) .................................. 09 54593

(51) Int. Cl.
*H01L 21/44*     (2006.01)

(52) U.S. Cl. ........ 438/675; 438/633; 438/660; 438/687; 257/E21.582

(58) Field of Classification Search .................. 438/675, 438/687, 629, 633, 660, 631; 257/E21.582
See application file for complete search history.

(56) References Cited

U.S. PATENT DOCUMENTS

| | | | |
|---|---|---|---|
| 6,762,091 B2 * | 7/2004 | Joo et al. | 438/253 |
| 6,943,105 B2 * | 9/2005 | Joshi | 438/622 |
| 7,375,031 B2 * | 5/2008 | Preusse et al. | 438/660 |
| 2004/0104481 A1 * | 6/2004 | Ong | 257/758 |
| 2007/0238294 A1 * | 10/2007 | Beyer et al. | 438/687 |
| 2009/0035936 A1 * | 2/2009 | Boemmels et al. | 438/652 |
| 2009/0102051 A1 | 4/2009 | Beyer et al. | |

FOREIGN PATENT DOCUMENTS

EP     1 845 554 A2     10/2007

* cited by examiner

*Primary Examiner* — Michael Trinh
(74) *Attorney, Agent, or Firm* — Oblon, Spivak, McClelland, Maier & Neustadt, L.L.P.

(57) ABSTRACT

The method comprises affixing a thin sheet of crystal (8) onto metal (6) of same type as the sheet but amorphous or of small grain size, deposited in trenches of a substrate (1) to form interconnect lines for example. Annealing progressively imposes the crystalline structure of the sheet onto the lines. When the crystal (8) is removed, highly conductive crystalline lines are obtained since the grains thereof have been greatly enlarged.

20 Claims, 1 Drawing Sheet

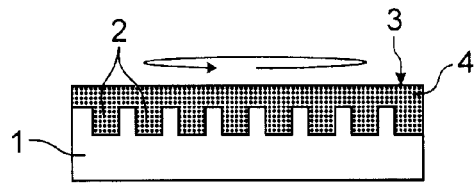 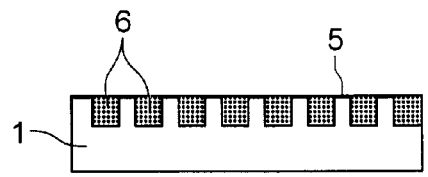
FIG.1  FIG.2
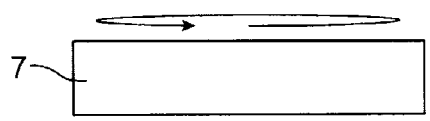 
FIG.3  FIG.4
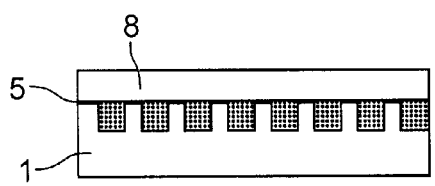 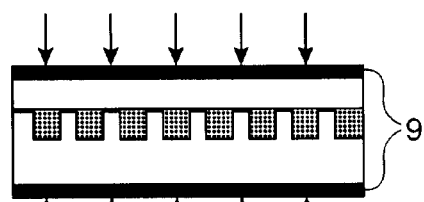
FIG.5  FIG.6
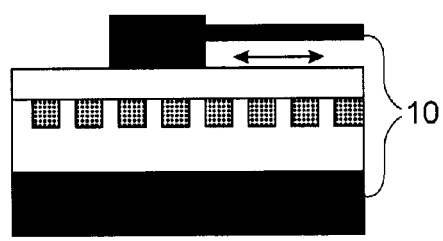 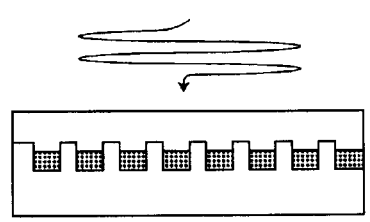
FIG.7  FIG.8
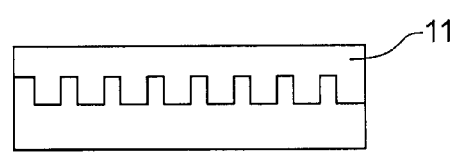 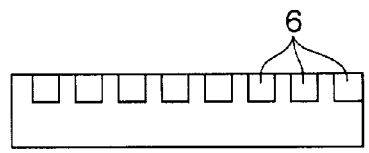
FIG.9  FIG.10

METHOD FOR CREATING A METAL CRYSTALLINE REGION, IN PARTICULAR IN AN INTEGRATED CIRCUIT

The invention pertains to a method for creating a metal crystalline region, in particular in an integrated circuit.

The conductivity of a metal is dependent upon its crystalline structure, which is why it is sought to control the formation thereof for the interconnect lines of circuits whose material has been deposited in trenches of a substrate: the formation of single-crystalline lines or at least of large-grain crystalline lines would provide particularly good conductivity accompanied by lowered heating and improved electricity transmission, the defects of electron transport being more particularly concentrated at the grain boundaries; yet these defects become increasingly more evident with the growing demand for increasingly narrower interconnects.

The objective of the invention is therefore to control the crystalline microstructure of elements, such as the interconnect lines of integrated circuits, to obtain a said single-crystalline structure or large grain structure in which the grain boundaries are eliminated. The grains obtained on fabrication typically have a size of the order of 1 to 100 nm, when the metal structure is not amorphous. The invention sets out to obtain a crystalline structure with grains of the order of 100 times larger, so as to have only one grain or a small number of grains over the length of the interconnect lines (1 to 10 μm or more). The size of the grains can be defined as their mean dimension.

The state of the art comprises the knowledge that the crystalline structure of a continuous metal medium, composed of interconnect lines formed in trenches of a substrate, and of an upper (build-up)layer which covers the lines extending over the entire surface of the substrate and which was formed during the same deposit step as the lines, is firstly modified in this upper layer when heat treatment such as annealing is performed, before reaching the underlying lines by means of the continuity of the metal medium that is set up. Anneal treatments are commonly used to increase grain size in the lines made from very small grains obtained by depositing. The article <<Cu grain growth in interconnects trenches—Experimental characterization of the overburden effect>>, by Carreau et al (published in Microelectronic Engineering no 85 (2008), p. 2133-2136), describes this phenomenon.

Document US-A-2009/035936 mentions that the orientation of the grains of a metal layer can be modified by depositing upon it another layer having the desired grain orientation, followed by annealing. The grains of this deposited layer may be larger than those of the layer it covers, but no effect on the grain size of this layer is mentioned.

The invention concerns a method for creating a metal region, comprising the steps of:
- forming at least one hollowed region in a substrate,
- depositing a metal in the hollowed region and, thereupon, forming a continuous build-up layer having a first grain size,
- fully or partially removing the build-up layer, characterized by the steps of:
- polishing a free surface of the metal,
- contacting a free surface of the metal with a lower surface of a crystal of the same metal having a second grain size larger than the first size, the lower surface of the crystal having been subjected to a polishing operation,
- annealing the metal and the crystal,
- removing the crystal.

The second grain size (considered taking into account the mean grain size for example) may be at least one hundred times larger than the first, to obtain full benefit from the advantages of the invention.

Compared with the prior art, the essential steps comprise removing the build-up layer, where modification of the structure arises according to current knowledge, and replacing the same by a crystal having the desired structure for all the metal, fabricated separately and joined to the metal deposited in the trenches by affixing to the substrate. The inventors have ascertained that the crystalline structure also imposes itself on the metal filling the trenches, despite the lack of crystallographic continuity with the trench metal; all that is required is to set up sufficiently close contact therebetween, facilitated by polishing.

The interconnect metal thus transformed can be chosen from among copper, silver or aluminium; the substrate can be chosen from among silicon, germanium and SIC (silicon carbide).

The added crystal must generally be of sufficient thickness so that its influence can be exerted over the entire depth of the line. A value of 50 nm is recommended under certain usual conditions.

The close contacting may comprise mechanical pressing, molecular bonding or soldering.

The invention will now be described in connection with FIGS. 1 to 10 which illustrate the successive steps of the method.

FIG. 1 shows the first step in the process of creating a metal crystalline region.
FIG. 2 shows the second step in the process.
FIG. 3 shows the third step in the process.
FIG. 4 shows the fourth step in the process.
FIG. 5 shows the fifth step in the process.
FIG. 6 shows the sixth step in the process.
FIG. 7 shows the seventh step in the process.
FIG. 8 shows the eighth step in the process.
FIG. 9 shows the ninth step in the process.
FIG. 10 shows the tenth step in the process.

Trenches 2 were cut in a substrate 1, then metal material 3 was deposited on the substrate 1, filling the trenches and also forming a build-up layer 4 (FIG. 1). A preliminary step is polishing to remove the build-up layer 4 in full or in part. Depositing 3 is often electrochemical but the invention also functions with other deposit processes and with composite deposits in which a lower barrier layer and a first conductive layer are deposited by physical or chemical vapour phase deposit, or by electrochemistry. However, it is possible to implement the invention by leaving a residue of build-up layer so that a free, continuous surface 5 subsists of the metal (FIG. 2). The residue is of narrow thickness, less than about 10 nm if such exists. The metal in the trenches forms conductor lines 6.

A single-crystal 7 of same metal type as the deposit 3 was also prepared (FIG. 3) and its thickness optionally reduced by polishing (FIG. 4) to obtain a fairly thin layer for exact application onto the free surface 5 of the other part. As already mentioned, the invention would be just as operative using a polycrystal having much larger grains than those of the deposit 3. The reduced single-crystal carries reference 8. Its thickness must remain sufficient however to induce the recrystallization that is described below, and also for more practical handling thereof. A thickness of 50 nm for example appears necessary for copper lines 100 nm in width and 180 nm in height, and values much higher than these, of more than 100 nm, even a few microns, may be preferred for a copper layer. The polishing operations performed on the build-up layer 4 and the single-crystal 7 may comprise high finishing using the CMP process (chemical mechanical polishing) or using a vibrating table; the polished surfaces are finally de-oxidized.

The following step, illustrated in FIG. 5, comprises the affixing of the single-crystal 8 onto the free surface 5 via the polished, de-oxidized surfaces. Close contact between the surfaces must be maintained. Although it is envisaged that mere molecular bonding is sufficient to obtain such contact, consideration is also given to recourse to stronger processes than pressing processes, such as diffusion bonding, hot uniaxial compression bonding (FIG. 6), molecular bonding or ultrasonic bonding (FIG. 7) using appropriate pressing 9 and solder 10 equipment. Ultrasonic bonding appears to be particularly suitable. The following step, illustrated in FIG. 8, is annealing of the assembly which is performed, depending upon dimensions, at a temperature of between 200° C. and 600° C. for a time of between one minute and a few hours, for interconnect lines in copper. The temperature and duration of annealing are determined empirically in accordance with the material to be modified. The pressure to be exerted also depends on various conditions, inter alia on the mode of application: a pressure of a few megapascals (5 MPa or possibly 10 MPa for example) can be recommended for bonding via uniaxial pressure, of a few tens of megapascals (e.g. 30 MPa) for friction bonding, but it may also be very low for molecular bonding. The single-crystal, at first limited to layer 8, progressively extends into the lines 6 by propagating from top downwards. The condition shown in FIG. 9 is finally obtained: all the metal has become single-crystalline.

The bonding and annealing steps may be conducted simultaneously when the temperature required for bonding is sufficiently high to re-crystallize the metal.

A last step is polishing to remove the upper metal layer 11 that is continuous over the substrate 1, derived from the single-crystal 8 and forming a new build-up layer, and to fully separate the lines 6 from each other. Polishing may be rough polishing, then increasingly finer as in the preliminary steps of the method. On completion of polishing as illustrated in FIG. 10, the lines are single-crystalline, all have the same orientation, and the circuit is ready for use or for the deposit of other layers of material.

The invention claimed is:

1. A method for creating producing a crystalline metal region, the method comprising:
   (A) forming at least one hollowed region in a substrate;
   (B) depositing a metal on the substrate to fill in the hollowed region and form a continuous metal build-up layer having a first grain size;
   (C) polishing a free surface of the metal build-up layer to partially or fully remove the metal build-up layer;
   (D) contacting the free surface of the metal on the substrate with a lower polished surface of a crystal comprising the same metal and having a second grain size which is larger than the first grain size, to obtain an upper metal layer on the substrate;
   (E) annealing the substrate; and
   (F) removing the upper metal layer on the substrate.

2. The method of claim 1, wherein the metal is selected from the group consisting of copper, silver, and aluminum.

3. The method of claim 1, wherein the substrate is selected from the group consisting of silicon, germanium, and silicon carbide.

4. The method of claim 1, wherein the crystal has a thickness of at least 50 nm.

5. The method according of claim 1, wherein the contacting comprises pressing.

6. The method according to of claim 1, wherein the contacting comprises bonding.

7. The method of claim 6, wherein the bonding is ultrasonic bonding.

8. The method of claim 1, wherein the contacting comprises molecular bonding.

9. The method of claim 1, wherein the second grain size is at least 100 times larger than the first grain size.

10. The method of claim 1, wherein the metal is copper.

11. The method of claim 1, wherein the metal is silver.

12. The method of claim 1, wherein the metal is aluminum.

13. The method of claim 1, wherein the substrate is silicon.

14. The method of claim 1, wherein the substrate is germanium.

15. The method of claim 1, wherein the substrate is silicon carbide.

16. The method of claim 10, wherein the crystal has a thickness of at least 50 nm.

17. The method of claim 6, wherein the bonding and the annealing are simultaneous.

18. The method of claim 6, wherein the bonding comprises hot uniaxial compression bonding.

19. The method of claim 6, wherein the bonding comprises diffusion bonding.

20. The method of claim 1, wherein the annealing is carried out at a temperature in a range of 200° C. to 600° C.

* * * * *